(12) United States Patent
Ono et al.

(10) Patent No.: US 8,405,073 B2
(45) Date of Patent: Mar. 26, 2013

(54) ORGANIC THIN FILM TRANSISTOR WITH A PROTECTIVE LAYER BETWEEN SOURCE AND DRAIN ELECTRODES AND ELECTRONIC DEVICE

(75) Inventors: Hideki Ono, Tokyo (JP); Akihiro Nomoto, Kanagawa (JP); Iwao Yagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 28 days.

(21) Appl. No.: 13/029,383

(22) Filed: Feb. 17, 2011

(65) Prior Publication Data

US 2011/0215406 A1 Sep. 8, 2011

(30) Foreign Application Priority Data

Mar. 8, 2010 (JP) ................................ 2010-050481

(51) Int. Cl.
*H01L 51/10* (2006.01)

(52) U.S. Cl. ................... 257/40; 257/E51.005

(58) Field of Classification Search ............... 257/40, 257/66, 642–643, E29.117, E29.147, E29.151, 257/E29.182, E29.202, E29.273
See application file for complete search history.

(56) References Cited

U.S. PATENT DOCUMENTS

| | | | |
|---|---|---|---|
| 2006/0099526 A1* | 5/2006 | Yang | 430/58.5 |
| 2008/0014496 A1* | 1/2008 | Watanabe et al. | 429/129 |
| 2009/0230385 A1* | 9/2009 | Jang et al. | 257/40 |
| 2010/0267197 A1* | 10/2010 | Shieh et al. | 438/104 |

FOREIGN PATENT DOCUMENTS

JP 2008-085200 4/2008

* cited by examiner

*Primary Examiner* — Davienne Monbleau
*Assistant Examiner* — Selim Ahmed
(74) *Attorney, Agent, or Firm* — SNR Denton US LLP

(57) ABSTRACT

A thin film transistor capable of stably obtaining good performance is provided. The thin film transistor includes an organic semiconductor layer, and a protective layer and a source electrode and a drain electrode formed on the organic semiconductor layer. The protective layer is disposed at least in a region between the source electrode and the drain electrode.

5 Claims, 8 Drawing Sheets

ORGANIC THIN FILM TRANSISTOR WITH A PROTECTIVE LAYER BETWEEN SOURCE AND DRAIN ELECTRODES AND ELECTRONIC DEVICE

BACKGROUND OF THE INVENTION

1. Field of the Invention

The present invention relates to a thin film transistor having an organic semiconductor layer and an electronic device using the thin film transistor.

2. Description of Related Art

Recently, a thin film transistor (TFT) using an organic semiconductor layer as a channel layer, called organic TFT, has been noticed. The organic TFT allows the channel layer to be formed by a coating method, leading to reduction in manufacturing cost. In addition, since the channel layer may be formed at low temperature compared with that formed by an evaporation method, the organic TFT may be mounted on a flexible plastic film having low heat resistance.

The organic TFT is investigated to be used as a switching element for an electronic device such as a display device in the same way as previous inorganic TFT using an inorganic semiconductor layer as a channel layer, and has an organic semiconductor layer, and a source electrode and a drain electrode connected to the organic semiconductor layer.

The organic TFT is classified into a top contact type or a bottom contact type depending on a positional relationship of the organic semiconductor layer to the source and drain electrodes in the same manner as the inorganic TFT. In particular, the top contact type is regarded as promising since the source and drain electrodes are disposed to lie on the organic semiconductor layer, leading to reduction in contact resistance between the organic semiconductor layer and the source and drain electrode, and improvement in mechanical stability of the layer and the electrode.

Meanwhile, the top contact type has a difficulty where since the organic semiconductor layer has a low resistance to organic solvents, microfabrication using organic solvents is hardly performed without damaging the organic semiconductor layer in a step of forming the source electrode and the drain electrode.

However, proposal is recently made on a method of forming the source electrode and the drain electrode on the organic semiconductor layer by using a liftoff method (for example, see Japanese Unexamined Patent Application Publication No. 2008-085200).

SUMMARY OF THE INVENTION

In a manufacturing process of the inorganic TFT, when a source electrode and a drain electrode are formed, typically, an electrode layer is formed on an inorganic semiconductor layer and then etched. Etching technology such as dry etching is a mature technology and therefore is reliable in the light of productivity and processing accuracy. Moreover, since the inorganic semiconductor layer is excellent in etching resistance, even if the layer is over-etched, performance of the inorganic TFT is substantially not affected.

Even in a manufacturing process of the organic TFT, etching technology such as wet etching is desirably similarly used to form the source electrode and the drain electrode on the organic semiconductor layer. However, etching resistance of the organic semiconductor layer is extremely low compared with the inorganic semiconductor layer, and the organic semiconductor layer having a low organic-solvent resistance is easily damaged by an etchant. Therefore, etching significantly affects performance of the organic TFT. In such a case, degradation of performance of the organic TFT is caused not only by reduction in thickness of the organic semiconductor layer but also by surface adsorption and diffusion of ingredients of chemicals.

It is desirable to provide a thin film transistor having stable and good performance and an electronic device using the thin film transistor.

A thin film transistor according to an embodiment of the invention includes an organic semiconductor layer, and a protective layer and a source electrode and a drain electrode formed on the organic semiconductor layer. The protective layer is disposed at least in a region between the source electrode and the drain electrode. An electronic device according to an embodiment of the invention has the above-mentioned thin film transistor.

According to the thin film transistor or the electronic device of the embodiment of the invention, the protective layer is provided on the organic semiconductor layer at least in the region between the source electrode and the drain electrode. In this configuration, the organic semiconductor layer is protected by the protective layer in a formation step (an etching step) of the source electrode and the drain electrode, and therefore the organic semiconductor layer is less likely to be damaged by etching. Accordingly, good performance may be stably obtained.

Other and further objects, features and advantages of the invention will appear more fully from the following description.

DETAILED DESCRIPTION OF THE PREFERRED EMBODIMENTS

Figure 1:
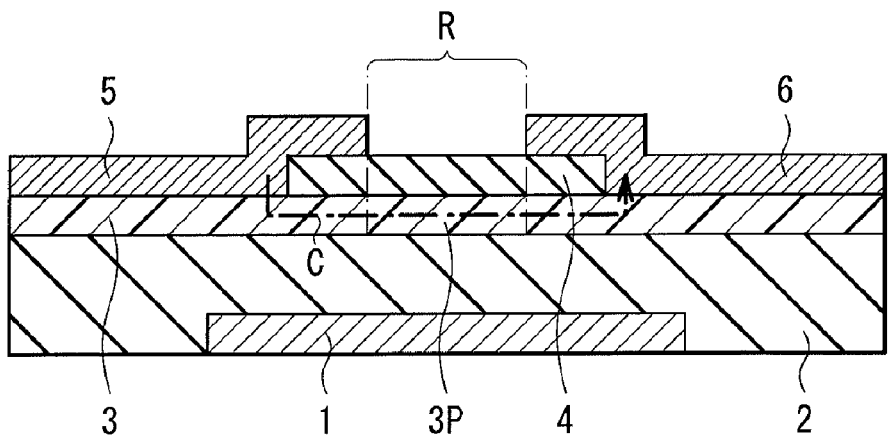
FIG. 1 is a sectional diagram showing a configuration of a thin film transistor according to a first embodiment of the invention.
Figure 2:
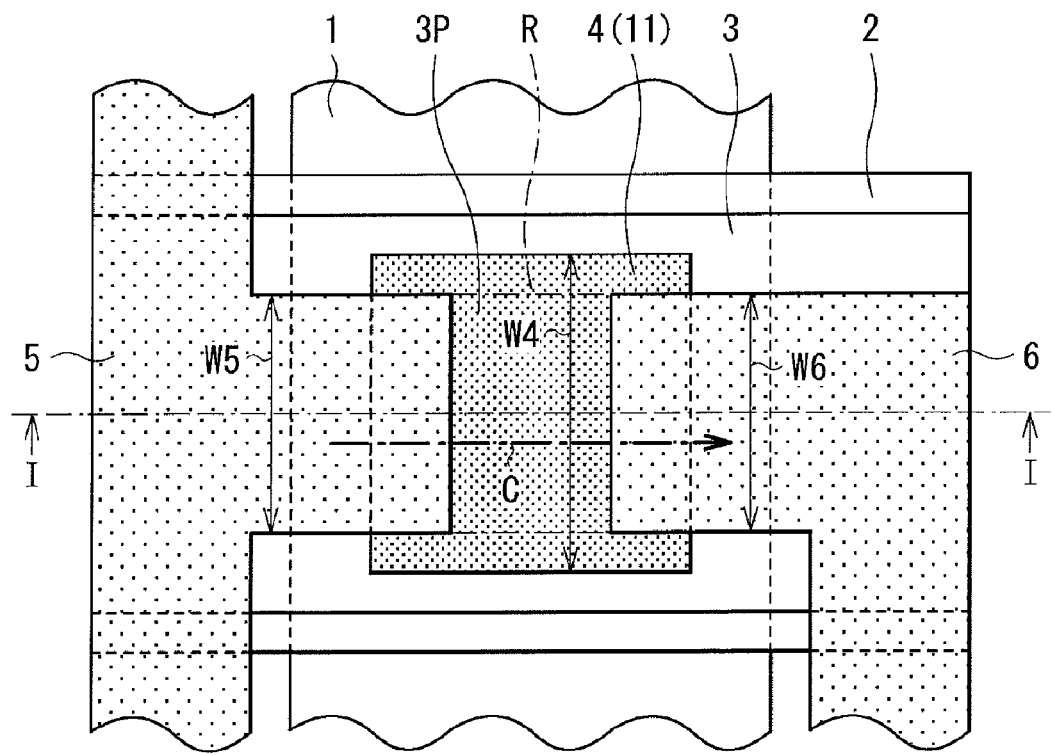
FIG. 2 is a plan diagram showing the configuration of the thin film transistor shown in FIG. 1.

Hereinafter, preferred embodiments of the invention will be described in detail with reference to drawings. Description is made in the following sequence.
1. Thin film transistor
  1-1. First embodiment (protective layer of insulating material)
  1-2. Second embodiment (protective layer of semiconductor material)
2. Application examples of thin film transistor (electronic devices)
  2-1. Liquid crystal display device
  2-2. Organic EL display device
  2-3. Electronic paper display device
1. Thin Film Transistor
1-1. First Embodiment (Protective Layer of Insulating Material)
Configuration of Thin Film Transistor FIGS. 1 and 2 show sectional and planar configurations of an organic TFT as a thin film transistor of the embodiment, respectively, where FIG. 1 shows a section along a line I-I shown in FIG. 2.

In the organic TFT, an organic semiconductor layer 3 and a protective layer 4 are disposed opposite a gate electrode 1 with a gate insulating layer 2 in between, and a source electrode 5 and a drain electrode 6, which are separated from each other, are connected to the organic semiconductor layer 3.

The organic TFT described herein is of a top contact/bottom gate type where the gate electrode 1 is located below the organic semiconductor layer 3, and the source electrode 5 and the drain electrode 6 lie on the organic semiconductor layer 3.

The gate electrode 1 is formed of, for example, one or at least two of metal materials, inorganic conductive materials, organic conductive materials, or carbon materials. The metal materials include, for example, aluminum (Al), copper (Cu), molybdenum (Mo), titanium (Ti), chromium (Cr), nickel (Ni), palladium (Pd), gold (Au), silver (Ag) and platinum (Pt), or an alloy including such metal. The inorganic conductive materials include, for example, indium oxide ($In_2O_3$), indium-tin oxide (ITO), indium-zinc oxide (IZO), and zinc oxide (ZnO). The organic conductive materials include, for example, polyethylenedioxythiophene (PEDOT) and polystyrene sulfonate (PSS). The carbon materials include, for example, graphite. The gate electrode 1 may have a multilayer structure including two or more layers of any of the materials. Similarly, the following gate insulating layer 2 and the like may have such a multilayer structure.

The gate insulating layer 2 is formed to cover the gate electrode 1, and is formed of, for example, one or at least two of inorganic or organic insulating materials. The inorganic insulating materials include, for example, silicon oxide ($SiO_x$), silicon nitride ($SiN_x$), aluminum oxide ($Al_2O_3$), titanium oxide ($TiO_2$), hafnium oxide ($HfO_x$) and barium titanate ($BaTiO_3$). The organic insulating materials include, for example, polyvinyl phenol (PVP), polyimide, polymethacrylic acrylate, photosensitive polyimide, photosensitive novolak resin and polyparaxylylene.

The organic semiconductor layer 3, which is formed on the gate insulating layer 2, is formed of, for example, one or at least two of organic semiconductor materials such as low-molecular materials, soluble low-molecular materials or high-molecular materials. The low-molecular materials are typically hardly soluble in solvents, and include, for example, pentacene, anthradithiophene, dinaphto[2,3-b:2',3'-f]thieno[3,2-b]thienophene, 2,9-diphenyl-peri-xanthenoxanthene, 2,9-dinaphthyl-peri-xanthenoxanthene and copper phthalocyanine. The soluble low-molecular materials, which are improved in solubility by chemically modifying the low-molecular materials, include, for example, 6,13-bis(triisopropylsilylethynyl)pentacene, 2,7-didodecyl[1]benzothieno[3,2-b][1]benzothiophene, and 2,9-bis(p-ethylphenyl)-peri-xanthenoxanthene. The high-molecular materials include, for example, α-quarter-thiophene, poly-(β-hexylthiophene), and poly(2,5-bis(3-dodecyl-5-(3-dodecylthiophene-2-yl) thiophene-2-yl)thiazolo[5,4-d]thiazole).

The organic semiconductor materials may further include, for example, the following materials: acene compounds such as tetracene, anthracene, 2,9-dimethylpentacene, rubrene, or perfluoropentacene; anthradithiophene compounds such as α,ω-dialkylanthradithiophene; peri-xanthenoxanthene compounds such as 2,9-bis(p-propylphenyl)-peri-xanthenoxanthene; naphto[1,8-bc:5,4-b'c']dithiophene compounds such as 2,6-di(2-naphtyl)naphto[1,8-bc:5,4-b'c']dithiophene; benzodithiophene compounds such as 2,6-diphenylbenzo[1,2-b:4,5-b']dithiophene; [1]benzothieno[3,2-b][1]benzothiophene compounds such as 2,7-diphenyl[1]benzothieno[3,2-b][1]benzothiophene; oligothiophene and oligoselenophene compounds such as α-quarter-selenophene; β-substituted thiophene polymer and oligomer compounds such as poly-(3,3'''-didodecyl-quarter-thiophene); α,ω-substituted thiophene oligomer compounds such as α,ω-dihexyl-quarter-thiophene; condensed thiophene oligomer compounds such as bis(benzodithiophene); thiophene-phenylene oligomer compounds such as 2,5-bis(4-n-hexylphenyl)thiophene; thiophene-fluorene oligomer compounds such as 5,5'-bis-(7-hexyl-9H-fluorene-2-yl)-[2,2']bithiophene; thiophene-acene oligomer compounds such as 6,6'-dihexyl-[2,2']bianthracenyl; phthalocyanine compounds such as phthalocyanine or zinc phthalocyanine; porphyrin compounds such as tetrabenzoporphyrin; and fullerene compounds such as $C_{60}$.

The protective layer 4 protects the organic semiconductor layer 3 during manufacturing of the organic TFT (an etching step for forming the source electrode 5 and the drain electrode 6). The protective layer 4 is formed on the organic semiconductor layer 3, and disposed in at least a region R between the source electrode 5 and the drain electrode 6. The organic semiconductor layer 3 (portion 3P) located in the region R substantially becomes a current channel between the source electrode 5 and the drain electrode 6. Since the protective layer 4 is disposed at least in the region R, the portion 3P is protected by the protective layer 4 in the etching step for forming the source electrode 5 and the drain electrode 6. This secures a current path C from the source electrode 5 to the drain electrode 6 via the organic semiconductor layer 3 (portion 3P).

A formation area of the protective layer 4 is not particularly limited as long as the area includes the region R. It is enough that width W4 of the protective layer 4 (darkly shaded area) is larger than width W5 or W6 of the source or drain electrode 5 or 6 (light shaded area) as shown in FIG. 2, respectively.

The protective layer 4, which is insulative, is formed of, for example, one or at least two of organic or inorganic insulating materials. The organic insulating materials include, for example, fluorine resin such as $(C_6F_{10})_n$, parylene resin, polyvinyl alcohol, and polyvinyl cinnamate. The inorganic insulating materials include, for example, silicon dioxide ($SiO_2$). In particular, the formation material of the protective layer 4 is preferably soluble in any arbitrary solvent. A coating or printing method may be thus used as a formation method of the protective layer 4, resulting in less damage to the organic semiconductor layer 3 during formation of the protective layer. Such a soluble material includes, for example, an organic insulating material such as water-soluble parylene resin or fluorine resin soluble in fluorine solvents. In such a case, the organic insulating material is preferably soluble in a solvent having no ability to dissolve the organic semiconductor layer 3, namely, the solvent is preferably an orthogonal solvent to the organic semiconductor layer 3 in order to prevent the organic semiconductor layer 3 from being unintentionally dissolved by a solvent during formation of the protective layer 4. The orthogonal solvent has ability to sufficiently dissolve the formation material of the protective layer 4 but has almost no ability to dissolve the formation material of the organic semiconductor layer 3. The expression "ability to sufficiently dissolve" means that the formation material of the protective layer 4 may be so dispersed in a solvent that a coating method may be used. The expression "almost no ability to dissolve" means that the organic semiconductor layer 3 is so insoluble in a solvent that electrical conductivity is significantly reduced. However, the formation method of the protective layer 4 is not necessarily limited to the coating method.

The source electrode 5 and the drain electrode 6 are formed on the organic semiconductor layer 3, and, for example, partially lie on the protective layer 4 respectively. The source electrode 5 and the drain electrode 6 are formed of, for example, the same material as of the gate electrode 1.

The organic TFT may have other components. Such components include, for example, a substrate for supporting the organic TFT. The substrate may be, for example, a substrate of a glass, plastic or metal material, or a film of a plastic or metal material. The plastic material includes, for example, polyether sulfone (PES), polycarbonate (PC), polyimide (PI), polyethylene terephthalate (PET), polyethylene naphthalate (PEN) or polyetheretherketone (PEEK). The metal material includes, for example, aluminum, nickel or stainless steel.

Manufacturing Method of Thin Film Transistor

Several procedures may be used to manufacture the organic TFT. FIGS. 3 to 6 illustrate a manufacturing method of the organic TFT, each figure showing a sectional configuration corresponding to FIG. 1. Since formation materials of a series of components have been described before, description of the materials is appropriately omitted hereinafter. The manufacturing method of the organic TFT described below is merely an example, and therefore formation materials, formation methods and thickness of components may be appropriately modified or altered.

First Manufacturing Method

Figure 3:
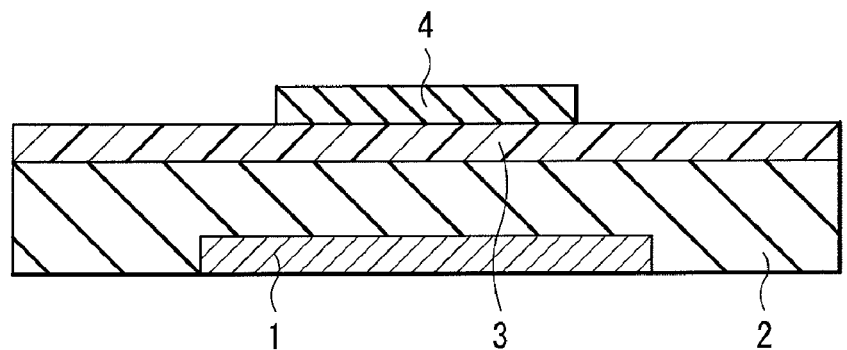
FIG. 3 is a sectional diagram for illustrating a manufacturing method (first manufacturing method) of the thin film transistor.

First, as shown in FIG. 3, the gate electrode 1 (for example, 30 nm thick) is patterned. Here, for example, a metal material layer of Cu is formed, and then a resist pattern is formed on the metal material layer. Next, the metal material layer is etched with a resist pattern as a mask, and then the resist pattern is removed.

A formation method of the metal material layer is, for example, a vacuum deposition method such as an evaporation method or a sputtering method. For forming the resist pattern, for example, a photoresist is coated to form a photoresist film, and then the photoresist film is patterned (exposed/developed) by a photolithography method or the like. An etching method of the metal material layer includes, for example, a dry etching method or a wet etching method, and the dry etching method includes, for example, an ion milling method or a reactive ion etching (RIE) method. For removing the mask, for example, ultraviolet light is irradiated on the resist pattern, and then the irradiated pattern is dipped in a developer (for example, tetramethylammonium hydroxide (3% in water)) for separation. A metal pattern may be used as the mask in place of the resist pattern.

Next, the gate insulating layer 2 is formed to cover the gate electrode 1. Here, for example, a mixed solution of PVP and a curing agent (for example, melamine resin) is prepared, and the mixed solution is coated by a spin coat method or the like, and then is fired. In firing, temperature and time are arbitrarily set.

Next, the organic semiconductor layer 3 is formed on the gate insulating layer 2. A formation method of the organic semiconductor layer 3 includes, for example, a coating or printing method using a solution containing pentacene or (triisopropylsilylethynyl)pentacene. The coating method includes, for example, a spin coat method, a cap coat method or a dip coat method, and the printing method includes, for example, an inkjet method. Alternatively, for example, a vacuum deposition method such as a vacuum evaporation method may be used to deposit pentacene or the like.

Next, the protective layer 4 (for example, 100 nm thick) is patterned on the organic semiconductor layer 3. Here, for example, a solution including fluorine resin (for example, $(C_6F_{10}O)_n$) dissolved in a fluorine solvent (for example, perfluorooctane) is prepared, and the solution is coated by a printing method or the like, and then is fired. The printing method includes, for example, a gravure printing method, a screen printing method, a relief printing method or an inkjet printing method. In firing, temperature and time are, for example, 100° C. and 10 min, respectively.

Photosensitive fluorine resin or photosensitive polyvinyl alcohol (PVA) may be used in place of the fluorine resin, and a photolithography method may be used in place of the printing method.

Figure 4:
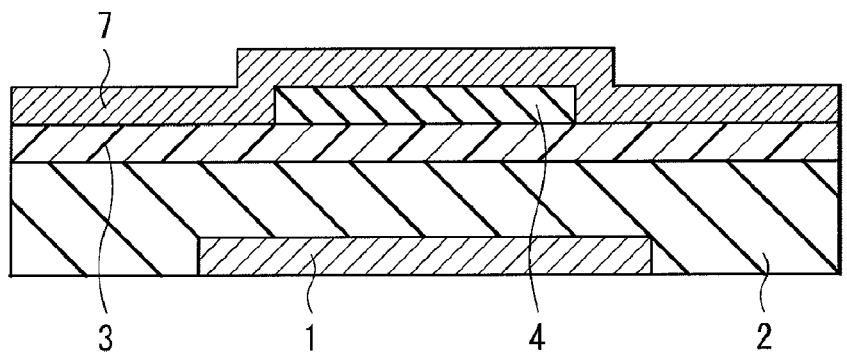
FIG. 4 is a sectional diagram for illustrating a step following FIG. 3.

Next, as shown in FIG. 4, an electrode layer 7 (for example, 100 nm thick) is formed to cover the protective layer 4 and the organic semiconductor layer 3 in the periphery of the protective layer 4. Here, gold, chromium or aluminum may be deposited by a resistance-heating evaporation method or the like. However, other vacuum deposition methods such as a sputtering method may be used.

Figure 5:
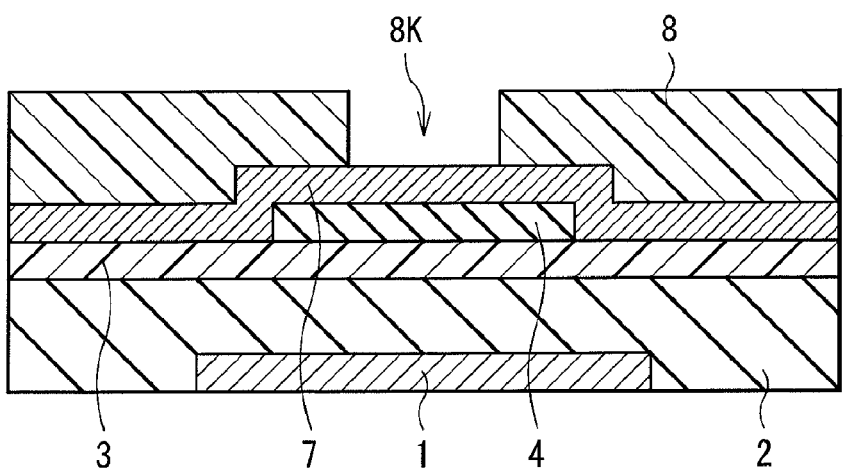
FIG. 5 is a sectional diagram for illustrating a step following FIG. 4.

Next, as shown in FIG. 5, a resist pattern 8 having an opening 8K is formed on the electrode layer 7. A formation procedure of the resist pattern 8 is the same as in the description of the gate electrode 1.

Finally, the electrode layer 7 is selectively etched with the resist pattern 8 as a mask. An etching method of the electrode layer 7 includes, for example, a wet etching method, where an etchant type may be arbitrarily selected depending on a formation material of the electrode layer 7. The etchant is, for example, a potassium iodide solution for gold; hydrochloric acid (HCl), hydrogen fluoride (HF) or a mixed solution of iron chloride ($FeCl_2$) and hydrochloric acid for chromium; and phosphoric acid ($H_3PO_4$), acetic acid ($CH_3COOH$) or nitric acid ($HNO_3$) for aluminum. This leads to formation of the source electrode 5 and the drain electrode 6 as shown in FIG. 1.

Then, the resist pattern 8 is removed in the same procedure as in the description of the gate electrode 1. Consequently, the organic TFT shown in FIGS. 1 and 2 is completed.

Second Manufacturing Method

For pattern-forming the protective layer 4, an etching method may be used in place of the printing method.

Figure 6:
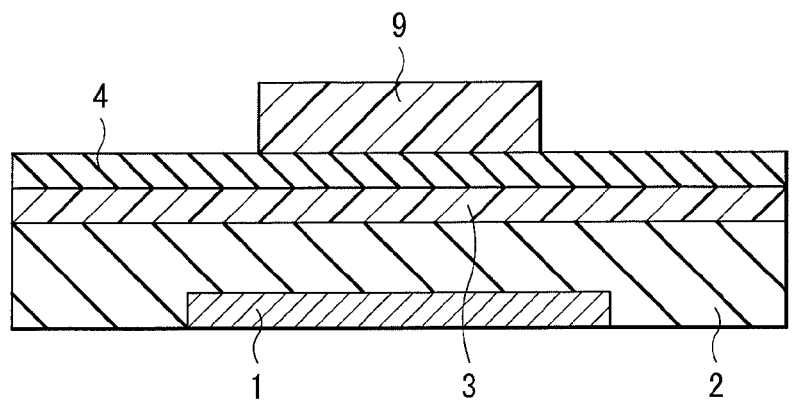
FIG. 6 is a sectional diagram for illustrating a manufacturing method (second manufacturing method) of the thin film transistor.

Specifically, the organic semiconductor layer 3 is formed in the same procedure as in the description with reference to FIG. 3, and then the protective layer 4 is formed to cover a surface of the organic semiconductor layer 3 as shown in FIG. 6.

Here, for example, an aqueous solution containing PVA or γ-butyrolactone solution containing polyvinyl cinnamate is coated by a coating method, and then is fired. Since a solvent of the former is water, the organic semiconductor layer 3 is hardly damaged during coating. Since a solvent (γ-butyrolactone) of the latter is an orthogonal solvent to (triisopropylsilylethynyl)pentacene, when a formation material of the organic semiconductor layer 3 is (triisopropylsilylethynyl)pentacene, the organic semiconductor layer 3 is hardly damaged. Alternatively, for example, a vacuum deposition method such as a chemical vapor deposition (CVD) method may be used to deposit parylene resin or the like.

Alternatively, for example, a vacuum deposition method such as CVD method may be used to deposit an inorganic insulating material such as silicon dioxide. In this case, for example, thickness of the protective layer 4 may be small (for example, 30 nm).

Other formation conditions (thickness, a firing condition and the like) of the protective layer 4 are, for example, the same as in the case using a printing method.

Next, a resist pattern 9 is formed on the protective layer 4. A formation procedure of the resist pattern 9 is, for example, the same as that of the resist pattern 8.

Next, the protective layer 4 is selectively etched with the resist pattern 9 as a mask. An etching method of the protective layer 4 includes, for example, an RIE method using oxygen gas ($O_2$) or a mixed gas of oxygen and tetrafluoromethane ($CF_4$). Then, the resist pattern 9 is removed in the same procedure as in the description of the gate electrode 1. Consequently, the protective layer 4 is patterned on the organic semiconductor layer 3 as shown in FIG. 3.

Finally, the source electrode 5 and the drain electrode 6 are formed in the same procedure as in the description with reference to FIGS. 4 and 5. Consequently, the organic TFT shown in FIGS. 1 and 2 is completed.

Operation and Effects of Thin Film Transistor

According to the organic TFT of the embodiment, the insulating protective layer 4 is formed on the organic semiconductor layer 3, and the protective layer 4 is disposed at least in the region R between the source electrode 5 and the drain electrode 6. In this configuration, as shown in FIGS. 1 and 5, since the organic semiconductor layer 3 (portion 3P) is protected by the protective layer 4 in an etching step of the electrode layer 7, the portion 3P is less likely to be damaged. In addition, since the protective layer 4 is insulative, even if the protective layer 4 remains on the completed organic TFT, the protective layer 4 does not electrically adversely affect the organic TFT. Accordingly, since an electric characteristic of the organic semiconductor layer 3 is not degraded during manufacturing, good performance may be stably obtained.

In particular, when a plurality of organic TFTs are integrated, the organic semiconductor layer 3 (portion 3P) is similarly protected by the protective layer 4 even in a formation step of an interlayer film or the like formed on each organic TFT. Specifically, for example, when the interlayer film is formed by a coating method using an organic solvent, the portion 3P is less likely to be damaged by the organic solvent. When the interlayer film is formed by a CVD method or a sputtering method, the portion 3P is less likely to be damaged by plasma. Accordingly, degradation of performance (for example, reduction in mobility or variation of a threshold value) of each organic TFT is suppressed, and therefore a plurality of organic TFTs may be stably integrated with performance of the TFTs being even. Obviously, the above advantage is similarly obtained even in the case that a film other than the interlayer film is formed on the organic TFT.

Modifications

Figure 7:
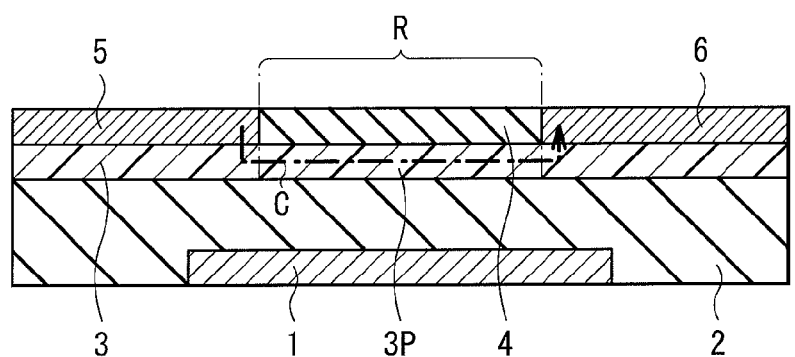
FIG. 7 is a sectional diagram showing a modification in configuration of the thin film transistor.
Figure 8:
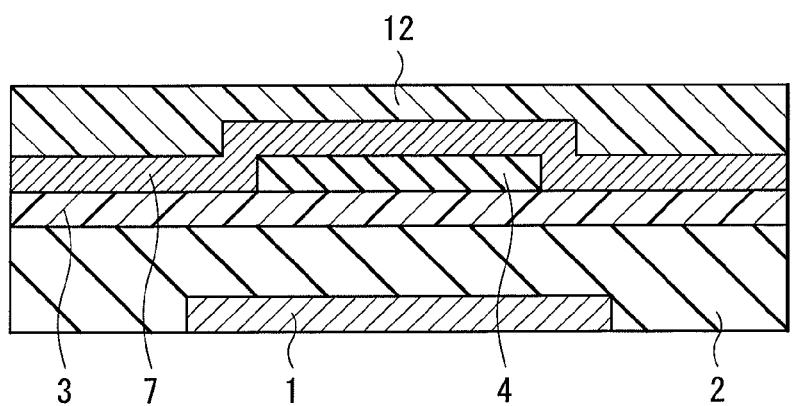
FIG. 8 is a sectional diagram for illustrating a manufacturing method of a thin film transistor (modification).
Figure 9:
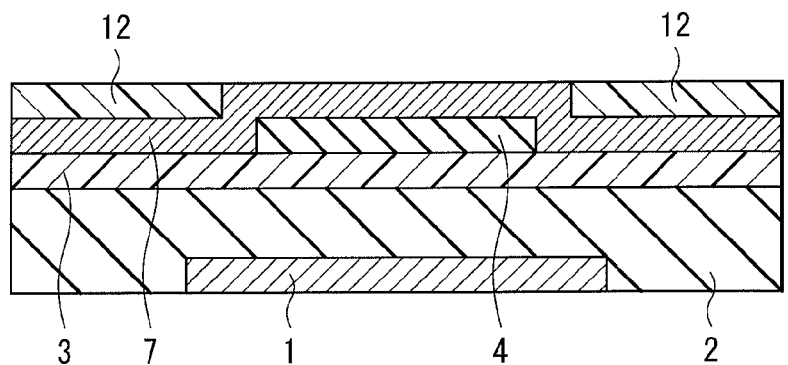
FIG. 9 is a sectional diagram for illustrating a step following FIG. 8.
Figure 10:
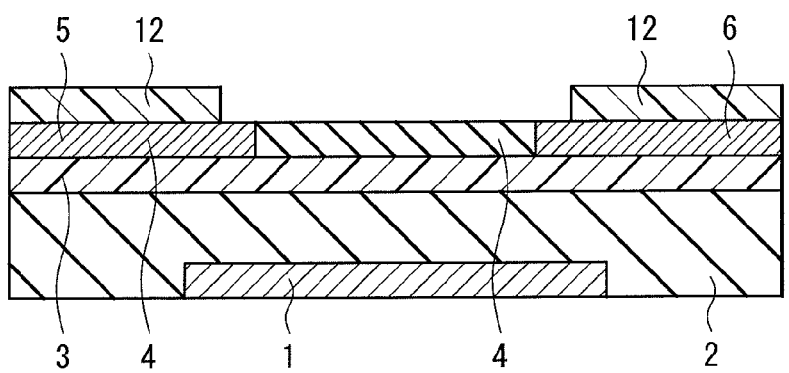
FIG. 10 is a sectional diagram for illustrating a step following FIG. 9.

As shown in FIG. 7 corresponding to FIG. 1, the source electrode 5 and the drain electrode 6 may not lie on the protective layer 4. When such source and drain electrode 5 and 6 are formed, for example, the electrode layer 7 is formed (FIG. 4), and then a photoresist is coated on a surface of the electrode layer 7 to form a photoresist film 12 as shown in FIG. 8. Next, the photoresist film 12 is etched by an etching back method so that the electrode layer 7 is exposed as shown in FIG. 9, and then an exposed portion of the electrode layer 7 is etched by a wet etching method or the like as shown in FIG. 10. As a result, the electrode layer 7 is divided into two portions with the protective layer 4 in between, and consequently the source electrode 5 and the drain electrode 6 are formed as shown in FIG. 7. According to such a procedure, the source electrode 5 and the drain electrode 6 are accurately set in position so that a gap is not formed with respect to the protective layer 4. Even in this case, since the organic semiconductor layer 3 (portion 3P) is protected by the protective layer 4 in an etching step of the electrode layer 7, the same effects as in the case shown with FIG. 1 may be obtained.

Figure 11:
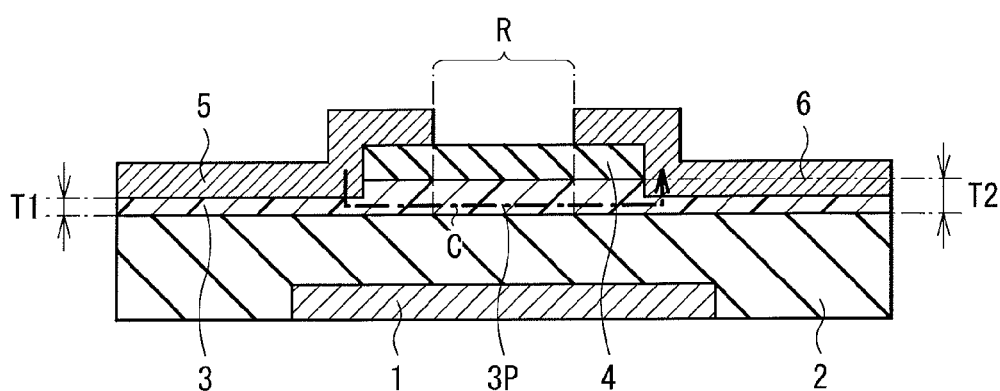
FIG. 11 is a sectional diagram showing another modification in configuration of the thin film transistor.
Figure 12:
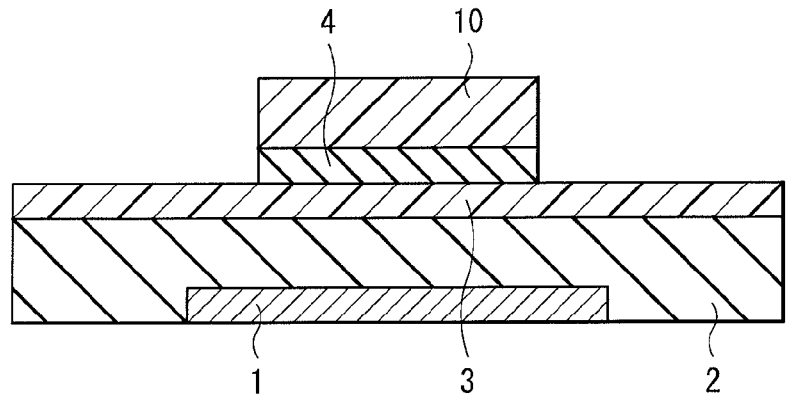
FIG. 12 is a sectional diagram for illustrating a manufacturing method of a thin film transistor (another modification).
Figure 13:
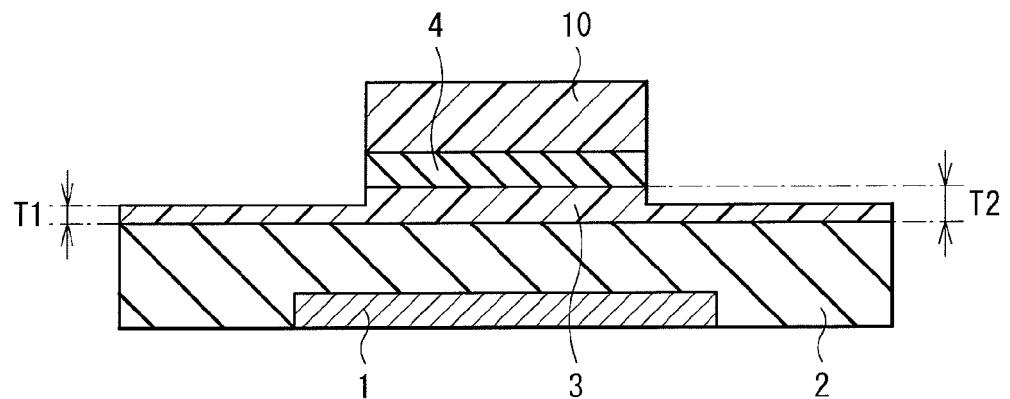
FIG. 13 is a sectional diagram for illustrating a step following FIG. 12.

As shown in FIG. 11 corresponding to FIG. 1, a portion of the organic semiconductor layer 3, being not adjacent to the protective layer 4, may have a thickness T1 smaller than thickness T2 of a portion adjacent to the protective layer 4. When such an organic semiconductor layer 3 is formed, after the protective layer 4 is formed (FIG. 3), for example, a resist pattern 10 is formed on the protective layer 4 as necessary as shown in FIG. 12. Next, as shown in FIG. 13, the organic semiconductor layer 3 is partially etched by a dry etching method or the like with the resist pattern 10 as a mask, and then the resist pattern 10 is removed. A formation procedure of the resist pattern 10 and an etching procedure of the organic semiconductor layer 3 are, for example, the same as the formation procedure of the resist pattern 8 and the etching procedure of the electrode layer 7, respectively. Then, the source electrode 5 and the drain electrode 6 are formed as shown in FIG. 11. Even in this case, the same effects as in the case shown with FIG. 1 may be obtained. In addition, since electric resistance of the portion of the organic semiconductor layer 3, having the thickness T1, is lower than electric resistance of the portion having the thickness T2, electric conductivity of a current path C may be improved.

Furthermore, a combination of configurations shown in FIGS. 7 and 11 may be used while being not specifically illustrated herein.

1-2. Second Embodiment (Protective Layer of Semiconductor Material)

Configuration of Thin Film Transistor

Figure 14:
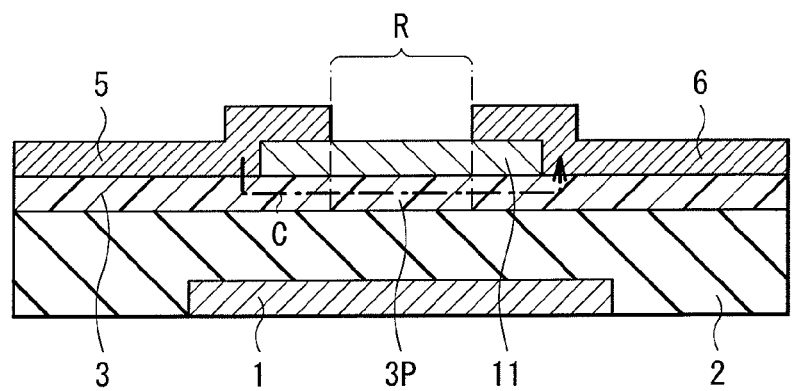
FIG. 14 is a sectional diagram showing a configuration of a thin film transistor according to a second embodiment of the invention.

FIG. 14, which corresponds to FIG. 1, shows a sectional configuration of organic TFT as a thin film transistor of the embodiment. The organic TFT has the same configuration as the organic TFT of the first embodiment except that a protective layer 11 is provided in place of the protective layer 4.

The protective layer 11 is formed of, for example, an organic semiconductor material different from the formation material of the organic semiconductor layer 3, and a type of the organic semiconductor material is determined depending on a formation material of an organic semiconductor layer 3.

When the organic semiconductor layer 3 includes a p-type semiconductor, the protective layer 11 is formed of an organic semiconductor material having a HOMO level deeper (lower) than a HOMO level of the formation material of the organic semiconductor layer 3. This causes the protective layer 11 to substantially serve as an insulating layer in relation to the organic semiconductor layer 3, the source electrode 5 and the drain electrode 6.

For example, when the formation material of the organic semiconductor layer 3 is pentacene, a formation material of the protective layer 11 is anthracene.

Specifically, while a HOMO level and a LUMO level of pentacene are −5.1 eV and −2.9 eV, respectively, a HOMO level and a LUMO level of anthracene are −6.0 eV and −2.0 eV, respectively. Therefore, the HOMO level of anthracene is deeper (lower) than the HOMO level of pentacene. In this case, since carriers are less likely to be injected into anthracene having a lower HOMO level, even if the protective layer 11 exists between the source electrode 5 and the drain electrode 6 while contacting the organic semiconductor layer 3, the protective layer 11 serves as an insulating layer.

When the organic semiconductor layer 3 includes an n-type semiconductor, the protective layer 11 is formed of, for example, an organic semiconductor material having a LUMO level shallower (higher) than a LUMO level of the formation material of the organic semiconductor layer 3. This causes the protective layer 11 to substantially serve as an insulating layer in relation to the organic semiconductor layer 3, the source electrode 5 and the drain electrode 6.

For example, when the formation material of the organic semiconductor layer 3 is [6,6]-phenyl-$C_{61}$-butyric acid methyl ester (PCBM), a formation material of the protective layer 11 is diphenylnaphthylamine (α-NPD).

Specifically, while a HOMO level and a LUMO level of PCBM are −6.1 eV and −3.7 eV, respectively, a HOMO level and a LUMO level of α-NPD are −5.3 eV and −2.3 eV, respectively. Therefore, the LUMO level of α-NPD is shallower (higher) than the LUMO level of PCBM. In this case, since carriers are less likely to be injected into α-NPD having a higher LUMO level, even if the protective layer 11 exists between the source electrode 5 and the drain electrode 6 while contacting the organic semiconductor layer 3, the protective layer 11 substantially serves as an insulating layer.

Other configurations of the protective layer 11 (such as a formation area including the region R shown in FIGS. 1 and 2) are the same as those of the protective layer 4 described in the first embodiment.

Manufacturing Method of Thin Film Transistor

A manufacturing method of the organic TFT is the same as that described in the first embodiment except that the protective layer 11 is formed in place of the protective layer 4. The method of manufacturing the organic TFT described below is merely an example, and therefore formation materials and formation methods of components and thickness thereof may be appropriately modified or altered.

A formation method of the protective layer 11 may be, for example, a vacuum deposition method such as an evaporation method or a coating method using a solution containing a predetermined solvent.

Before forming the electrode layer 7, it is acceptable that a hole injection layer or an electron injection layer is formed by the vacuum deposition method or the coating method, and then the layer is fired as necessary. When the hole injection layer or the like needs to be patterned, the layer may be etched together with the electrode layer 7, or may be separately etched. An etching method of the hole injection layer or the like includes, for example, an ashing method or RIE method.

Specifically, when the organic semiconductor layer 3 includes a p-type semiconductor, a hole injection layer may be formed between the organic semiconductor layer 3 and the source and drain electrodes 5 and 6. A HOMO level of the hole injection layer is preferably between a HOMO level of the organic semiconductor layer 3 and a work functions of the source and drain electrodes 5 and 6. A formation material of the hole injection layer includes, for example, diphenylnaphthylamine (α-NPD), 7,7,8,8-tetracyanoquinodimethane (TCNQ), copper phthalocyanine, polyethylendioxy thiophene (PEDOT)-polystyrene sulfonate (PSS), or carbon nanotube (CNT).

When the organic semiconductor layer 3 includes an n-type semiconductor, an electron injection layer may be formed between the organic semiconductor layer 3 and the source and drain electrodes 5 and 6. A LUMO level of the electron injection layer is preferably between a LUMO level of the organic semiconductor layer 3 and a work function of the source or drain electrode 5 or 6. A formation material of the electron injection layer includes, for example, fullerene ($C_{60}$) or CNT.

Operation and Effects of Thin Film Transistor

According to the organic TFT of the embodiment, the protective layer 11, which substantially serves as an insulating layer, is formed on the organic semiconductor layer 3, and the protective layer 11 is disposed at least in a region R between the source electrode 5 and the drain electrode 6. Accordingly, an electric characteristic of the organic semiconductor layer 3 is not degraded during manufacturing due to the same operation as in the first embodiment, and therefore good performance may be stably obtained. Other effects are the same as in the first embodiment.

While it is not specifically illustrated herein, the modifications described in the first embodiment with reference to FIGS. 7 and 11 may be similarly applied to the organic TFT of the embodiment. Even in such a case, the same effects may be obtained.

2. Application Examples of the Thin Film Transistor (Electronic Devices)

Next, application examples of the thin film transistor (organic TFT) will be described. The organic TFT may be applied to, for example, several electronic devices as sequentially described below. The following device configurations and circuit configurations are merely examples, and therefore may be appropriately modified or altered.

2-1. Liquid Crystal Display Device

Figure 15:
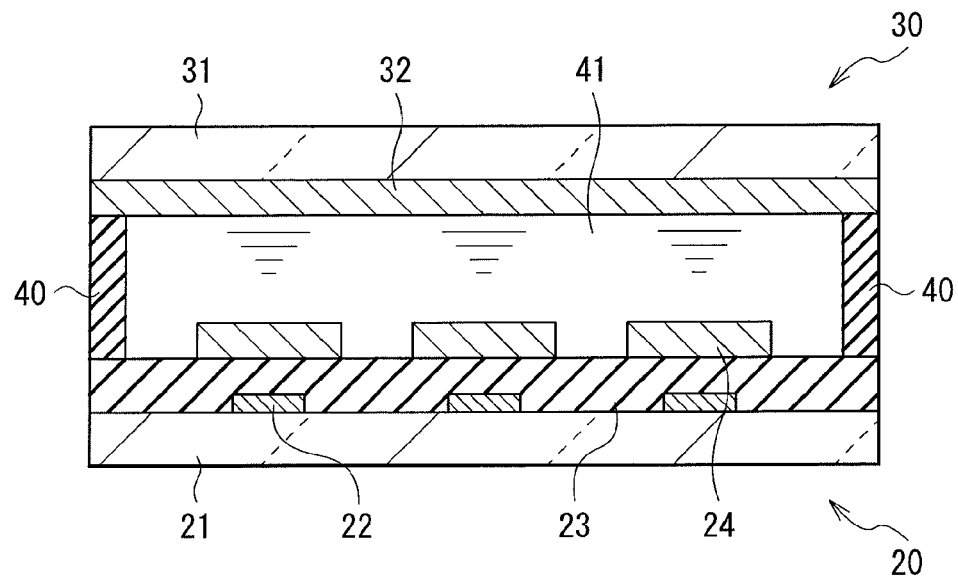
FIG. 15 is a sectional diagram showing a configuration of a major part of a liquid crystal display device as an application example of the thin film transistor.
Figure 16:
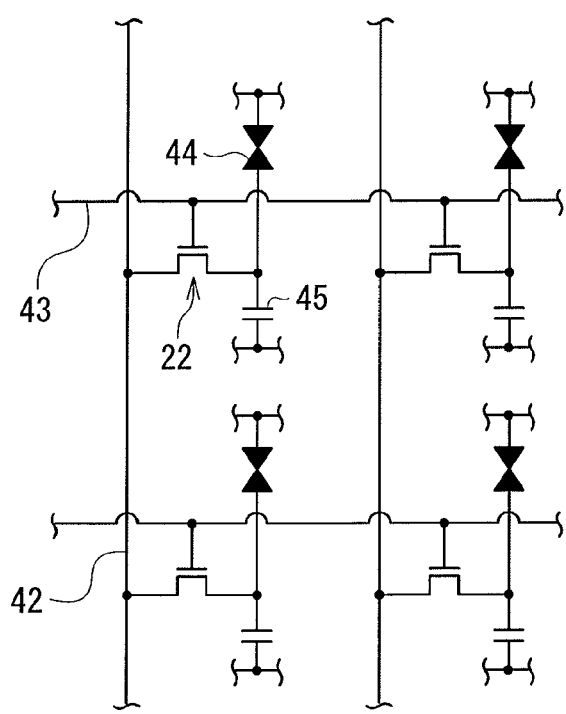
FIG. 16 is a diagram showing a circuit configuration of the liquid crystal display device shown in FIG. 15.

The organic TFT is applied to, for example, a liquid crystal display device. FIGS. 15 and 16 show a sectional configuration and a circuit configuration of a major part of the liquid crystal display device, respectively.

The liquid crystal display device described herein is, for example, an active-matrix transmissive liquid crystal display using organic TFTs, where the organic TFTs are used as elements for switching (pixel selection). The liquid crystal display device includes a liquid crystal layer 41 enclosed between a drive substrate 20 and a counter substrate 30 as shown in FIG. 15.

The drive substrate 20 is, for example, made such that organic TFTs 22, a planarizing insulating layer 23 and pixel electrodes 24 are formed in this order on a surface of a support substrate 21, and the organic TFTs 22 and the pixel electrodes 24 are arranged in a matrix, respectively.

The support substrate 21 is formed of, for example, a light-transmissive material such as a glass or plastic material, and the organic TFTs 22 have the same configuration as the aforementioned organic TFT. A type of the plastic material is, for example, the same as in the description of the organic TFT. The planarizing insulating layer 23 is formed of, for example, an insulating resin material such as polyimide, and the pixel electrodes 24 are formed of, for example, a light-transmissive conductive material such as ITO. The pixel electrodes 24 are connected to the organic TFTs 22 through contact holes (not shown) provided in the planarizing insulating layer 23.

For example, the counter substrate 30 includes a counter electrode 32 formed over the whole area on a surface of a support substrate 31. The support substrate 31 is formed of, for example, a light-transmissive material such as a glass or plastic material, and the counter electrode 32 is formed of, for example, a light-transmissive conductive material such as ITO.

The drive substrate 20 and the counter substrate 30 are disposed with the liquid crystal layer 41 in between such that the pixel electrodes 24 are opposed to the counter electrode 32, and the substrates are attached to each other by a sealing member 40. A type of liquid crystal molecules in the liquid crystal layer 41 may be arbitrarily selected.

In addition, the liquid crystal display device may have other components such as a retardation plate, a polarizing plate, an alignment film and a backlight unit (each being not shown).

A circuit for driving the liquid crystal display device includes, for example, the organic TFTs 22, liquid crystal display elements 44 (element sections including the pixel electrodes 24, the counter electrode 32 and the liquid crystal layer 41), and capacitors 45 as shown in FIG. 16. In the circuit, a plurality of signal lines 42 are arranged in a column direction, and a plurality of scan lines 43 are arranged in a row direction, and the organic TFT 22, the liquid crystal display element 44 and the capacitor 45 are disposed in a position corresponding to each of intersections of the signal lines 42 and the scan lines 43. A source electrode, a gate electrode and a drain electrode in the organic TFT 22 are not limitedly connected to objects as in an aspect shown in FIG. 16, and may be connected to other objects in an arbitrarily modified manner. The signal lines 42 and the scan lines 43 are connected to a not-shown signal line driver circuit (data driver) and a not-shown scan line driver circuit (scan driver), respectively.

In the liquid crystal display device, a liquid crystal display element 44 is selected by the organic TFT 22, and an electric field is thus applied between a pixel electrode 24 and a counter electrode 32 of the liquid crystal display element 44, and thus an alignment state of liquid crystal molecules in the liquid crystal layer 41 is changed depending on intensity of the electric field. Consequently, the amount of transmitted light (transmittance) is controlled depending on the alignment state of the liquid crystal molecules, leading to grayscale image display.

According to the liquid crystal display device, since the organic TFT 22 has the same configuration as the aforementioned organic TFT, an electric characteristic of the organic TFT 22 is maintained during manufacturing. Accordingly, good display performance may be stably obtained.

The liquid crystal display device may be not only of a transmission type but also of a reflection type.

2-2. Organic EL Display Device

Figure 17:
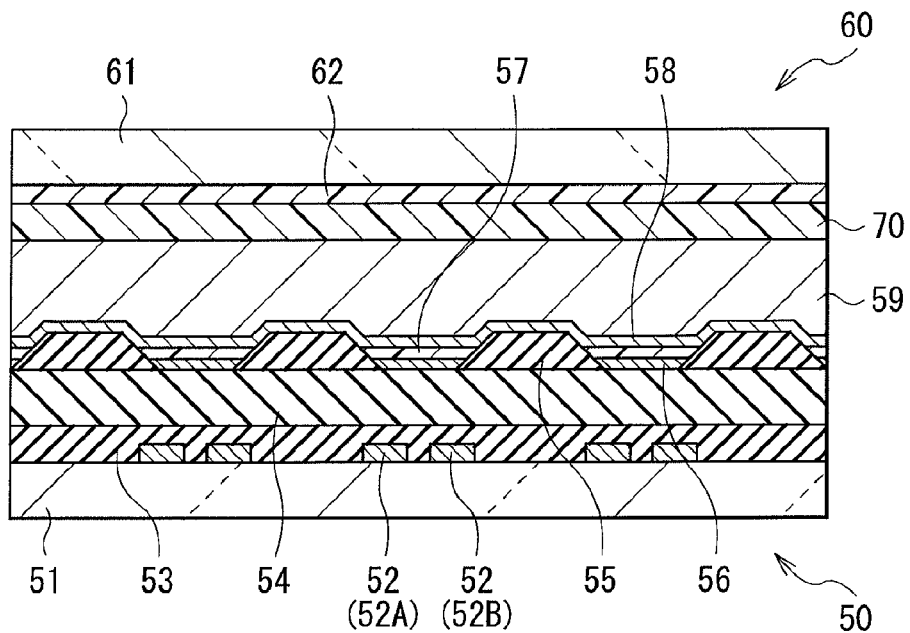
FIG. 17 is a sectional diagram showing a configuration of a major part of an organic electroluminescence (EL) display device as another application example of the thin film transistor.
Figure 18:
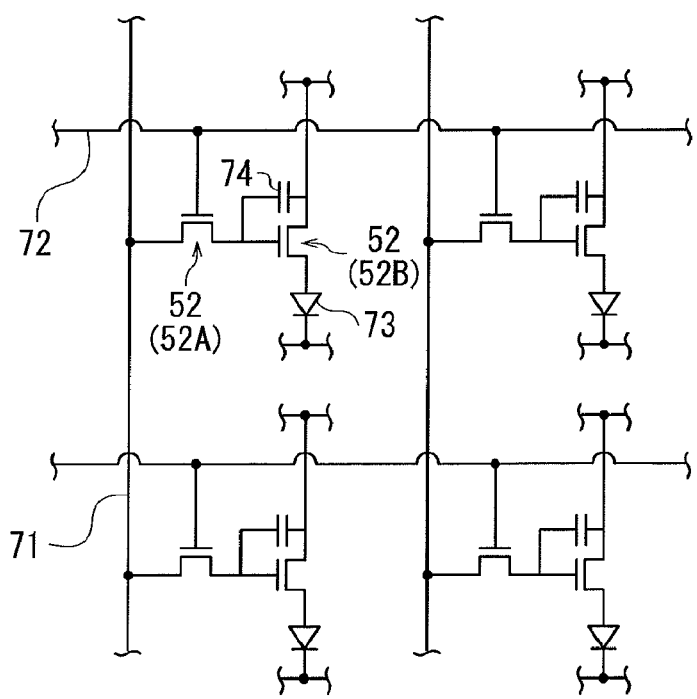
FIG. 18 is a diagram showing a circuit configuration of the organic EL display device shown in FIG. 17.

The organic TFT is applied to, for example, an organic EL display device. FIGS. 17 and 18 show a sectional configuration and a circuit configuration of a major part of the organic EL display device, respectively.

The organic EL display device described herein is, for example, an active-matrix organic EL display using organic TFTs as switching elements. The organic EL display device, in which a drive substrate 50 and a counter substrate 60 are attached to each other with an adhesion layer 70 in between as shown in FIG. 17, is, for example, of a top emission type where light is emitted through the counter substrate 60.

The drive substrate 50 is, for example, made such that organic TFTs 52 (52A and 52B), a protective layer 53, a planarizing insulating layer 54, pixel-separating insulating layers 55, pixel electrodes 56, organic layers 57, a counter electrode 58 and a protective layer 59 are formed in this order on a surface of a support substrate 51. The organic TFTs 52, the pixel electrodes 56 and the organic layers 57 are arranged in a matrix, respectively. Here, for example, two organic TFTs 52 (selection TFT 52A and drive TFT 52B) are included in one pixel.

The support substrate 51 is formed of, for example, a glass or plastic material. For the top emission type, since light is extracted through the counter substrate 60, the support substrate 51 may be formed of either of light-transmissive and non-light-transmissive materials. The organic TFTs 52 have the same configuration as the aforementioned organic TFT, and the protective layer 53 is formed of, for example, a polymer material such as polyvinyl alcohol (PVA) or polyparaxylylene. The planarizing insulating layer 54 and the pixel-separating insulating layers 55 are formed of, for example, an insulating resin material such as polyimide.

The pixel electrode 56 is formed of, for example, a reflective material such as aluminum, silver, titanium or chromium, and the counter electrode 58 is formed of, for example, a light-transmissive conductive material such as ITO or IZO. However, the counter electrode 58 may be formed of a light-transmissive metal material such as calcium (Ca) or an alloy of the metal, or a light-transmissive organic conductive material such as PEDOT. The organic layer 57 includes a light emitting layer generating light of red, green or blue, and may have a multilayer structure including a hole transport layer and an electron transport layer as necessary. A formation material of the light emitting layer may be arbitrarily selected depending on a color of generated light. While the pixel electrodes 56 and the organic layers 57 are arranged in a matrix while being separated by the pixel-separating insulating layers 55, respectively, the counter electrode 58 continuously extends while being opposed to the pixel electrodes 56 with the organic layers 57 in between. The protective layer 59 is formed of, for example, a light-transmissive dielectric material such as silicon nitride (SiN). The pixel electrodes 56 are connected to the organic TFTs 52 through contact holes (not shown) provided in the protective layer 53 and the planarizing insulating layer 54.

For example, the counter substrate 60 includes a color filter 62 provided on a surface of a support substrate 61. The support substrate 61 is formed of, for example, a light-transmissive material such as a glass or plastic material, and the color filter 62 has a plurality of color regions corresponding to colors of light generated by the organic layers 57. However, the color filter 62 may be omitted.

The adhesion layer 70 includes, for example, an adhesive such as thermosetting resin.

A circuit for driving the organic EL display device includes, for example, the organic TFTs 52 (selection TFTs 52A and drive TFTs 52B), organic EL display elements 73 (element sections including the pixel electrodes 56, the organic layers 57 and the counter electrode 58), and capacitors 74 as shown in FIG. 18. In the circuit, the organic TFT 52, the organic EL display element 73 and the capacitor 74 are disposed in a position corresponding to each of intersections of a plurality of signal lines 71 and a plurality of scan lines 72. A source electrode, a gate electrode and a drain electrode of the selection TFT 52A or the drive TFT 52B are not limitedly connected to objects as in an aspect shown in FIG. 18, and may be connected to other objects in an arbitrarily modified manner.

In the organic EL display device, for example, an organic EL display element 73 is selected by the selection TFT 52A, and thus the organic EL display element 73 is driven by the drive TFT 52B. An electric field is thus applied between the pixel electrode 56 and the counter electrode 58, and consequently the organic layer 57 generates light. Here, for example, three organic EL display elements 73 adjacent to one another generate red light, green light and blue light, respectively. Such three kinds of color light are compositely emitted to the outside through the counter substrate 60, leading to gray-scale image display.

According to the organic EL display device, since the organic TFT 52 has the same configuration as the aforementioned organic TFT, good display performance may be stably obtained as in the liquid crystal display device.

The organic EL display device may be not only of the top emission type but also of a bottom emission type where light is emitted through the drive substrate 50, or may be of a dual emission type where light is emitted through both the drive substrate 50 and the counter substrate 60. In each case, one of the pixel electrode 56 and the counter electrode 58, which is located on an emission side, is formed of a light-transmissive material, and the other electrode on a non-emission side is formed of a reflective material.

2-3. Electronic Paper Display Device

Figure 19:
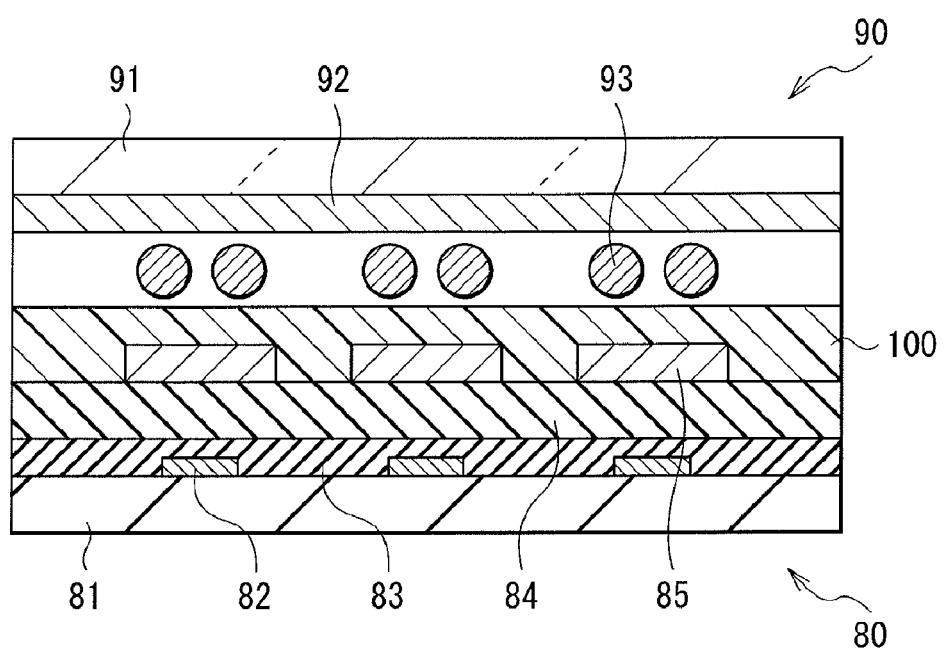
FIG. 19 is a sectional diagram showing a configuration of a major part of an electronic paper display device as still another application example of the thin film transistor.

The organic TFT is applied to, for example, an electronic paper display device. FIG. 19 shows a sectional configuration of the electronic paper display device.

The electronic paper display device described herein is, for example, an active-matrix electronic paper display using organic TFTs as switching elements. The electronic paper display device is, for example, made such that a drive substrate 80 and a counter substrate 90 including a plurality of electrophoresis elements 93 are attached to each other with an adhesion layer 100 in between.

The drive substrate 80 is, for example, made such that organic TFTs 82, a protective layer 83, a planarizing insulating layer 84 and pixel electrodes 85 are formed in this order on a surface of a support substrate 81, and the organic TFTs 82 and the pixel electrodes 85 are arranged in a matrix, respectively. The support substrate 81 is formed of, for example, a glass or plastic material, and the organic TFTs 82 have the same configuration as the aforementioned organic TFT. The protective layer 83 and the planarizing insulating layer 84 are formed of, for example, an insulating resin material such as polyimide, and the pixel electrodes 85 are formed of, for example, a metal material such as silver (Ag). The pixel electrodes 85 are connected to the organic TFTs 82 through contact holes (not shown) provided in the protective layer 83 and the planarizing insulating layer 84.

The counter substrate 90 is, for example, made such that a counter electrode 92 and a layer including a plurality of electrophoresis elements 93 are formed in this order on a surface of a support substrate 91, and the counter electrode 92 is formed over the whole area on the surface. The support substrate 91 is formed of, for example, a light-transmissive material such as a glass or plastic material, and the counter electrode 92 is formed of, for example, a light-transmissive conductive material such as ITO. The electrophoresis element 93 includes, for example, charged particles that are enclosed in a microcapsule while being dispersed in an insulating liquid. The charged particles include, for example, black particles such as graphite particles and white particles such as titanium oxide particles.

In addition, the electronic paper display device may include other components (not shown) such as a color filter.

A circuit for driving the electronic paper display device has, for example, the same configuration as the circuit of the liquid crystal display device as shown in FIG. 16. The circuit of the electronic paper display device includes the organic TFTs 82 and electronic paper display elements (element sections including the pixel electrodes 85, the counter electrode 92 and the electrophoresis elements 93) in place of the organic TFTs 22 and the liquid crystal display elements 44, respectively.

In the electronic paper display device, an electronic paper display element is selected by the organic TFT 82, and an electric field is thus applied between a pixel electrode 85 and a counter electrode 92 of the electronic paper display element, and thus the black or white particles in an electrophoresis element 93 are attracted to the counter electrode 92 depending on intensity of the electric field. This causes contrast expressed by the black and white particles, leading to gray-scale image display.

According to the electronic paper display device, since the organic TFT 82 has the same configuration as the aforementioned organic TFT, good display performance may be stably obtained as in the liquid crystal display device.

While the invention has been described with several embodiments hereinbefore, the invention is not limited to the aspects described in the embodiments, and various modifications and alterations may be made. For example, the thin film transistor of the invention may be not only of the top contact/bottom gate type but also of a top contact/top gate type. To describe with FIG. 1 as an example, in the top contact/top gate type, a gate insulating layer 2 and a gate electrode 1 are formed in this order on a protective layer 4 and source and drain electrode 5 and 6. Moreover, for example, electronic devices using the thin film transistor of the invention may include display devices other than the above display devices including the liquid crystal display device, or may include electronic devices other than display devices. Even in such cases, good performance may be stably obtained.

The present application contains subject matter related to that disclosed in Japanese Priority Patent Application JP 2010-050481 filed in the Japan Patent Office on Mar. 8, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:
1. A thin film transistor comprising:
an organic semiconductor layer; and
a protective layer, a source electrode and a drain electrode on the organic semiconductor layer,
wherein,
the protective layer is partially overlapped by each of the source electrode and the drain electrode, and a thickness of the organic semiconductor layer is less in a portion not adjacent to the protective layer relative to a portion adjacent to the protective layer.

2. The thin film transistor according to claim 1, wherein the protective layer is formed of an organic insulating material or an inorganic insulating material.

3. The thin film transistor according to claim 1, wherein the protective layer is soluble in a solvent having no ability to dissolve the organic semiconductor layer.

4. The thin film transistor according to claim 1, wherein:
the organic semiconductor layer includes a p-type semiconductor, and the protective layer is formed of an organic semiconductor material having a HOMO level lower than that of the organic semiconductor layer, or
the organic semiconductor layer includes an n-type semiconductor, and the protective layer is formed of an organic semiconductor material having a LUMO level higher than that of the organic semiconductor layer.

5. An electronic device comprising a thin film transistor, the thin film transistor including:
an organic semiconductor layer, and
a protective layer, a source electrode and a drain electrode on the organic semiconductor layer,
wherein,
the protective layer is partially overlapped by each of the source electrode and the drain electrode, and
a thickness of the organic semiconductor layer is less in a portion not adjacent to the protective layer relative to a portion adjacent to the protective layer.

* * * * *